(12) United States Patent
Tan et al.

(10) Patent No.: US 9,877,408 B2
(45) Date of Patent: Jan. 23, 2018

(54) PACKAGE ASSEMBLY

(71) Applicant: Delta Electronics Int'l (Singapore) Pte Ltd, Singapore (SG)

(72) Inventors: Chad-Yao Tan, Singapore (SG); Da-Jung Chen, Singapore (SG)

(73) Assignee: DELTA ELECTRONICS INT'L (SINGAPORE) PTE LTD, Singapore (SG)

( * ) Notice: Subject to any disclaimer, the term of this patent is extended or adjusted under 35 U.S.C. 154(b) by 0 days.

(21) Appl. No.: 15/165,757

(22) Filed: May 26, 2016

(65) Prior Publication Data

US 2016/0353608 A1    Dec. 1, 2016

(30) Foreign Application Priority Data

May 29, 2015   (SG) .......................... 10201504275V

(51) Int. Cl.
| | |
|---|---|
| H05K 7/20 | (2006.01) |
| H01L 23/367 | (2006.01) |
| H01L 25/07 | (2006.01) |
| H02M 7/00 | (2006.01) |
| H01L 23/40 | (2006.01) |
| H01L 23/427 | (2006.01) |

(52) U.S. Cl.
CPC ....... *H05K 7/20254* (2013.01); *H01L 23/367* (2013.01); *H01L 23/3675* (2013.01); *H01L 25/07* (2013.01); *H02M 7/003* (2013.01); *H05K 7/20927* (2013.01); *H01L 23/4006* (2013.01); *H01L 23/427* (2013.01); *H01L 2023/4018* (2013.01); *H01L 2023/4043* (2013.01); *H01L 2023/4087* (2013.01)

(58) Field of Classification Search
CPC .... H02M 7/003; H02M 7/00; H05K 7/20254; H01L 2023/4043; H01L 23/427
USPC .......................................... 361/702
See application file for complete search history.

(56) References Cited

U.S. PATENT DOCUMENTS

| | | | | |
|---|---|---|---|---|
| 5,056,262 | A | * 10/1991 | Schweiss | .............. E05C 19/006 49/257 |
| 5,559,374 | A | * 9/1996 | Ohta | ....................... H01L 23/13 257/693 |
| 5,966,291 | A | * 10/1999 | Baumel | .............. H05K 7/20927 165/80.3 |

(Continued)

*Primary Examiner* — Dion R Ferguson
*Assistant Examiner* — Mandeep S Buttar
(74) *Attorney, Agent, or Firm* — Kirton McConkie; Evan R. Witt

(57) ABSTRACT

A package assembly includes a housing frame, a power module, a first heat dissipating module and a second heat dissipating module. The housing frame is fixed on the first heat dissipating module. The power module is disposed within a hollow part of the housing frame, and covers a first open end of the hollow part. The power module includes a first surface, a second surface and at least one pin. The first surface has a periphery region and a middle region. The second surface is attached on the first heat dissipating module. The at least one pin is disposed on the periphery region. The at least one pin is penetrated through the corresponding opening and partially exposed outside the housing frame. The second heat dissipating module is disposed within the hollow part and attached on the middle region of the first surface of the power module.

8 Claims, 8 Drawing Sheets

(56) References Cited

U.S. PATENT DOCUMENTS

| | | | | |
|---|---|---|---|---|
| 9,041,183 B2* | 5/2015 | Liang | ................... | H01L 25/072 |
| | | | | 257/691 |
| 2010/0271788 A1* | 10/2010 | Inoue | ................... | H05K 3/284 |
| | | | | 361/748 |
| 2013/0134572 A1* | 5/2013 | Lenniger | ............... | H01L 23/367 |
| | | | | 257/690 |

* cited by examiner

PACKAGE ASSEMBLY

FIELD OF THE INVENTION

The present invention relates to a package assembly, and more particularly to a package assembly for accommodating a power module and dissipating the heat of the power module to the surroundings by a double side cooling mechanism.

BACKGROUND OF THE INVENTION

Recently, the general trends in designing electronic devices are toward small size, light weightiness and easy portability. Moreover, with the increasing development of electronic industries, the internal circuitries of the electronic devices are gradually modularized. In other words, plural electronic components are integrated into a single circuit module. For example, a power module is one of the widely-used circuit modules. An example of the power module includes but is not limited to a DC-to-DC converter, a DC-to-AC converter or an AC-to-DC converter. After the electronic components (e.g. capacitors, resistors, inductors, transformers, diodes and transistors) are integrated as a power module, the power module may be installed on a system circuit board.

A conventional package structure of a power module will be illustrated as follows. Firstly, plural power semiconductor bare chips, plural passive components and plural pins are disposed on a first surface of a substrate. Through the pins, the power module can be connected with an external circuitry. In particular, the power semiconductor bare chips, the passive components and the pins are welded on the substrate via solder paste. Then, the power semiconductor bare chips, the passive components and the pins are connected with each other through conductive wires by a wire bonding process. Consequently, an exposed power module is produced. Moreover, the power semiconductor bare chips, the passive components and the pins of the exposed power module are covered by an inverted U-shaped covering member. The covering member has plural openings corresponding to the pins. The pins are penetrated through the corresponding openings and partially exposed outside the covering member. Meanwhile, the package structure of the power module is produced. Moreover, the exposed pins may be inserted into corresponding insertion holes of a printed circuit board. Moreover, a heat sink is attached on a second surface of the substrate, wherein the second surface is opposed to the first surface. In case that the power module is operated at a high voltage, a great deal of heat is generated. The heat sink attached on the second surface of the substrate can facilitate dissipating the heat to the surroundings.

However, since the heat sink is disposed on the second surface of the substrate, the heat of the power module is only able to be dissipated to the surroundings by a single side cooling mechanism. Moreover, since the covering member has higher thermal resistance and is not contacted with the heat sink, the covering member cannot provide a good thermal conduction path. In other words, the heat dissipating efficiency of the conventional package assembly is not satisfied.

SUMMARY OF THE INVENTION

An object of the present invention provides a package assembly for packaging a power module and dissipating the heat of the power module to the surroundings by a double side cooling mechanism. Consequently, the heat dissipating efficiency and the operation performance of the package assembly are enhanced, and the life span of the power module is extended.

Another object of the present invention provides a package assembly for packaging a power module and actively dissipating the heat of the power module to the surroundings. Consequently, the heat dissipating efficiency and the operation performance of the package assembly are enhanced, and the life span of the power module is extended.

An aspect of the present invention provides a package assembly. The package assembly includes a first heat dissipating module, a housing frame, a power module and a second heat dissipating module. The housing frame is fixed on the first heat dissipating module, and includes a top part, a bottom part, plural frame plates and a hollow part. The hollow part has a first open end and a second open end. The first open end is located beside the bottom part. The second open end is located beside the top part. The top part has at least one opening. The power module is disposed within the hollow part of the housing frame, and covers the first open end of the hollow part. The power module includes a first surface, a second surface and at least one pin. The first surface and the second surface are opposed to each other. The first surface has a periphery region and a middle region. The second surface of the power module is attached on the first heat dissipating module. The at least one pin is disposed on the periphery region of the first surface of the power module. The at least one pin is penetrated through the corresponding opening and partially exposed outside the top part of the housing frame. The second heat dissipating module is disposed within the hollow part of the housing frame and attached on the middle region of the first surface of the power module.

The above contents of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1A:
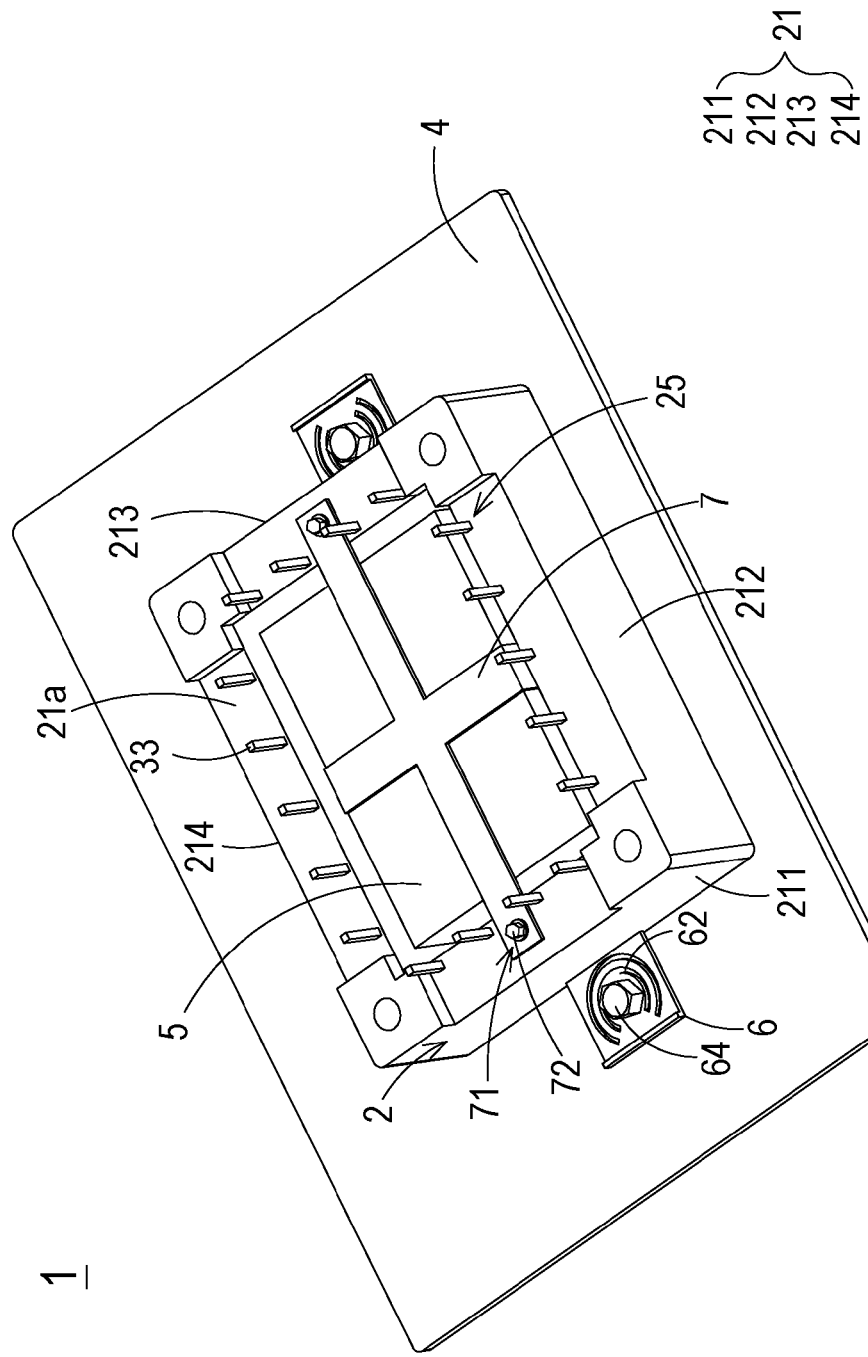
FIG. 1A is a schematic perspective view illustrating a package assembly according to a first embodiment of the present invention.
Figure 1B:
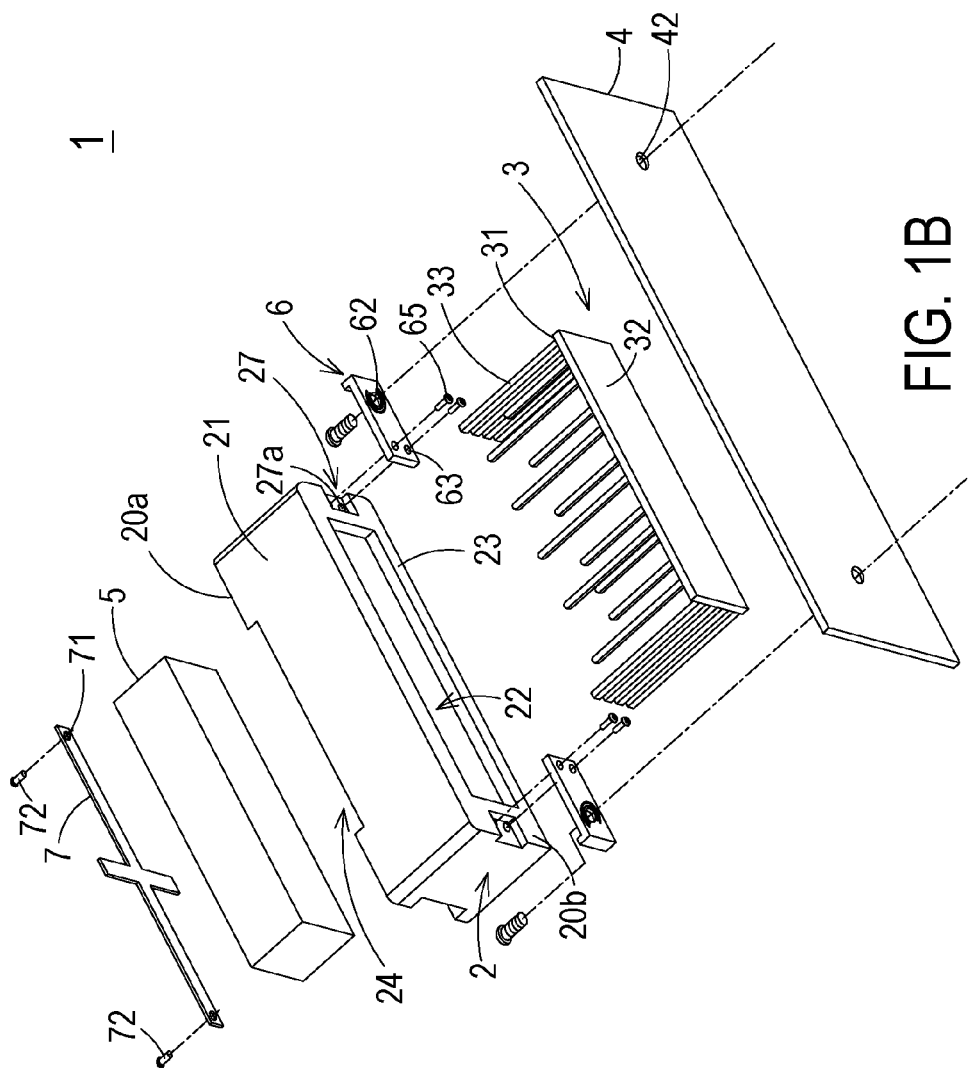
FIG. 1B is a schematic exploded view illustrating the package assembly of FIG. 1A.
Figure 1C:
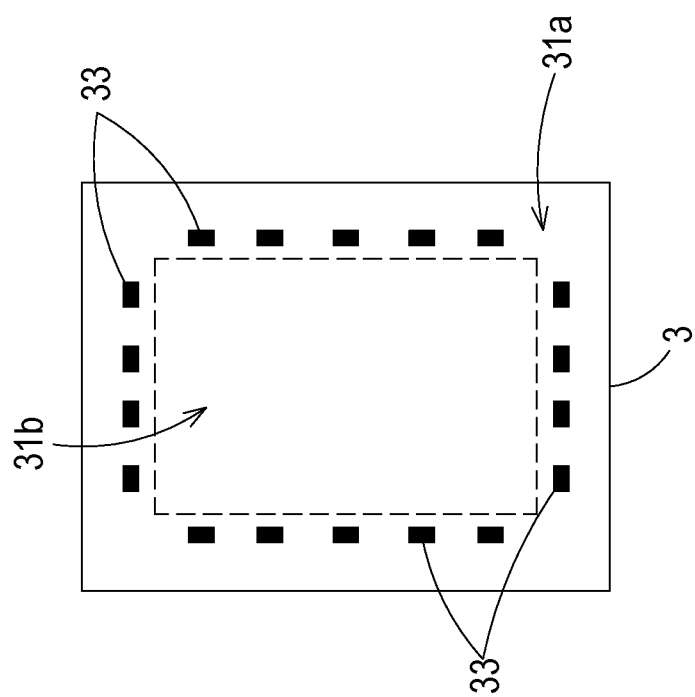
FIG. 1C is a schematic top view illustrating a power module of the package assembly of FIG. 1A.
Figure 1D:
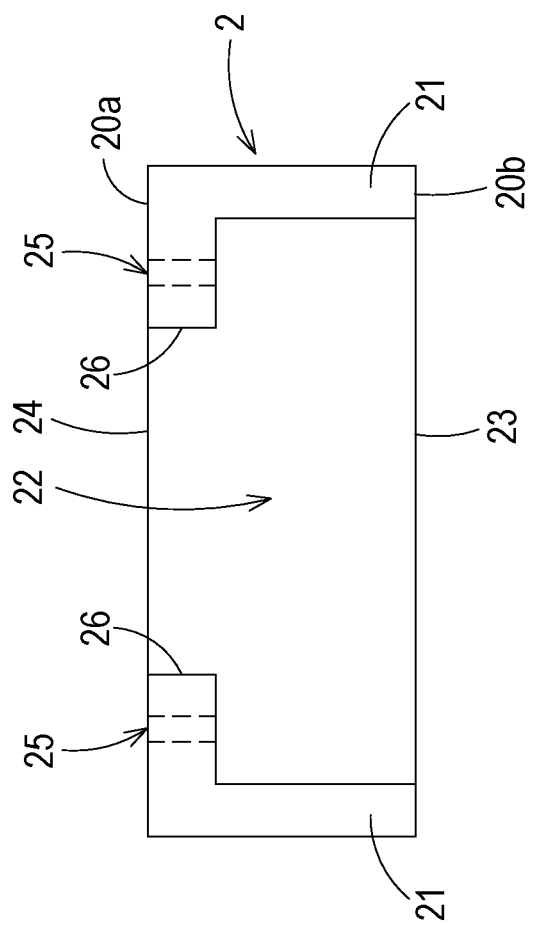
FIG. 1D is a schematic cross-sectional view illustrating a housing frame of the package assembly of FIG. 1A.

Please refer to FIGS. 1A-1D. FIG. 1A is a schematic perspective view illustrating a package assembly according to a first embodiment of the present invention. FIG. 1B is a schematic exploded view illustrating the package assembly of FIG. 1A. FIG. 1C is a schematic top view illustrating a power module of the package assembly of FIG. 1A. FIG. 1D is a schematic cross-sectional view illustrating a housing frame of the package assembly of FIG. 1A. The package assembly 1 comprises a housing frame 2, a power module 3, a first heat dissipating module 4 and a second heat dissipating module 5. The housing frame 2 is fixed on the first heat dissipating module 4. The housing frame 2 comprises a top part 20a, a bottom part 20b, plural frame plates 21 and a hollow part 22. The hollow part 22 has a first open end 23 and a second open end 24. The first open end 23 is located beside the bottom part 20b of the housing frame 2. The second open end 24 is located beside the top part 20a of the housing frame 2. The top part 20a of the housing frame 2 has at least one opening 25. The at least one opening 25 is in communication with the hollow part 22. The power module 3 is disposed within the hollow part 22 of the housing frame 2, and the first open end 23 is covered by the power module 3. The power module 3 comprises a first surface 31, a second surface 32 and at least one pin 33. The first surface 31 and the second surface 32 are opposed to each other. The first surface 31 of the power module 3 has a periphery region 31a and a middle region 31b. The second surface 32 of the power module 3 is attached on the first heat dissipating module 4. The at least one pin 33 is disposed on the periphery region 31a of the first surface 31 of the power module 3. The at least one pin 33 is penetrated through the corresponding opening 25 of the top part 20a of the housing frame 2 and partially exposed outside the top part 20a of the housing frame 2. The second heat dissipating module 5 is disposed within the hollow part 22 of the housing frame 2, and attached on the middle region 31b of the first surface 31 of the power module 3. Moreover, the first heat dissipating module 4 is configured to provide a first heat dissipating path for the power module 3, and the second heat dissipating module 5 is configured to provide a second heat dissipating path for the power module 3.

In this embodiment, the housing frame 2 is a rectangular hollow box. The hollow part 22 of the housing frame 2 is defined by the plural frame plates 21 of the housing frame 2 collaboratively. The top part 20a of the housing frame 2 further comprises an extension structure 26. The extension structure 26 is extended inwardly within the second open end 24. In this embodiment, the top part 20a of the housing frame 2 has plural openings 25. The plural openings 25 are discretely formed in the extension structure 26. Moreover, the plural openings 25 run through the extension structure 26 and are in communication with the hollow part 22. As shown in FIG. 1A, the housing frame 2 comprises four frame plates 21, including a first frame plate 211, a second frame plate 212, a third frame plate 213 and a fourth frame plate 214. The first frame plate 211 and the third frame plate 213 are opposed to each other. The first frame plate 211 and the second frame plate 212 are located adjacent to each other. The second frame plate 212 and the fourth frame plate 214 are opposed to each other.

The power module 3 is disposed within the hollow part 22 of the housing frame 2 and located beside the bottom part 20b of the housing frame 2. Moreover, the first open end 23 is covered by the power module 3. In this embodiment, the power module 3 comprises plural pins 33. The plural pins 33 are discretely disposed on the periphery region 31a of the first surface 31 of the power module 3. The plural pins 33 are accommodated within the hollow part 22 of the housing frame 2, penetrated through the corresponding openings 25 and partially protruded out of the top part 20a of the housing frame 2. Since the pins 33 are exposed outside, the pins 33 may be inserted into corresponding insertion holes of an external circuit (e.g., a printed circuit board) and electrically connected with the external circuit. An example of the power module 3 includes a plurality of electronic components embedded within a dielectric substrate. Moreover, the plural pins 33 are welded on the power module 3.

The second surface 32 of the power module 3 is attached on the first heat dissipating module 4. The first heat dissipating module 4 is configured to provide the first heat dissipating path for dissipating away the heat of the power module 3. The second heat dissipating module 5 is disposed within the hollow part 22 of the housing frame 2, and attached on the middle region 31b of the first surface 31 of the power module 3. The second heat dissipating module 5 is configured to provide the second heat dissipating path for dissipating away the heat of the power module 3. Consequently, while the operating power module 3 generates the heat, the first heat dissipating module 4 and the second heat dissipating module 5 of the package assembly 1 can dissipate away the heat of the power module 3 by a double side cooling mechanism. Consequently, the heat dissipating efficiency is enhanced. In an embodiment, both of the first heat dissipating module 4 and the second heat dissipating module 5 are passive heat dissipating module (e.g., cold plates).

The housing frame 2 is fixed on the first heat dissipating module 4 by a screwing means or any other appropriate fixing means. Please refer to FIGS. 1A-1D again. In this embodiment, the housing frame 2 further comprises two mounting brackets 6 and two first fastening elements 64. The two mounting brackets 6 are connected with the bottom part 20b of the housing frame 2 and located at two opposite sides of the bottom part 20b of the housing frame 2. Each mounting bracket 6 has a first mounting hole 62. The first heat dissipating module 4 has two second mounting holes 42 corresponding to the first mounting holes 62 of the two mounting brackets 6, respectively. The first fastening element 64 is penetrated through the first mounting hole 62 of the corresponding mounting bracket 6 and tightened into the corresponding second mounting hole 42 of the first heat dissipating module 4, so that the housing frame 2 is fixed on the first heat dissipating module 4. In some embodiments, the housing frame 2 further comprises plural second fastening elements 65. A first end of the mounting bracket 6 has third mounting holes 63. Two receiving recesses 27 are formed in the bottom part 20b of the housing frame 2. Plural fourth mounting holes 27a are formed in each receiving recess 27. The first end of the mounting bracket 6 is locked into the corresponding receiving recess 27. The third mounting holes 63 of the mounting bracket 6 correspond to the fourth mounting holes 27a. The second fastening elements 65 are penetrated through the corresponding third mounting holes 63 and tightened into the corresponding fourth mounting holes 27a, so that the mounting brackets 6 are fixed on and connected to the bottom part 20b of the housing frame 2. Under this circumstance, the bottom surfaces of the mounting brackets 6 are coplanar with the surface of the bottom part 20b of the housing frame 2.

In this embodiment, the package assembly 1 of the present invention further comprises a fixing member 7. Preferably but not exclusively, the fixing member 7 has a crisscross-shaped structure. Moreover, the fixing member 7 further comprises at least one fixing hole 71 and at least one fastening element 72. The fastening element 72 is penetrated through the corresponding fixing hole 71 and tightened into the top part 20a of the housing frame 2. Consequently, the fixing member 7 is fixed on the top part 20a of the housing frame 2 and contacted with the second heat dissipating module 5. The fixing member 7 is used for fixing the second heat dissipating module 5 in the hollow part 22 of the housing frame 2 and allowing the second heat dissipating module 5 to be attached on the middle region 31b of the first surface 31 of the power module 3.

Figure 2A:
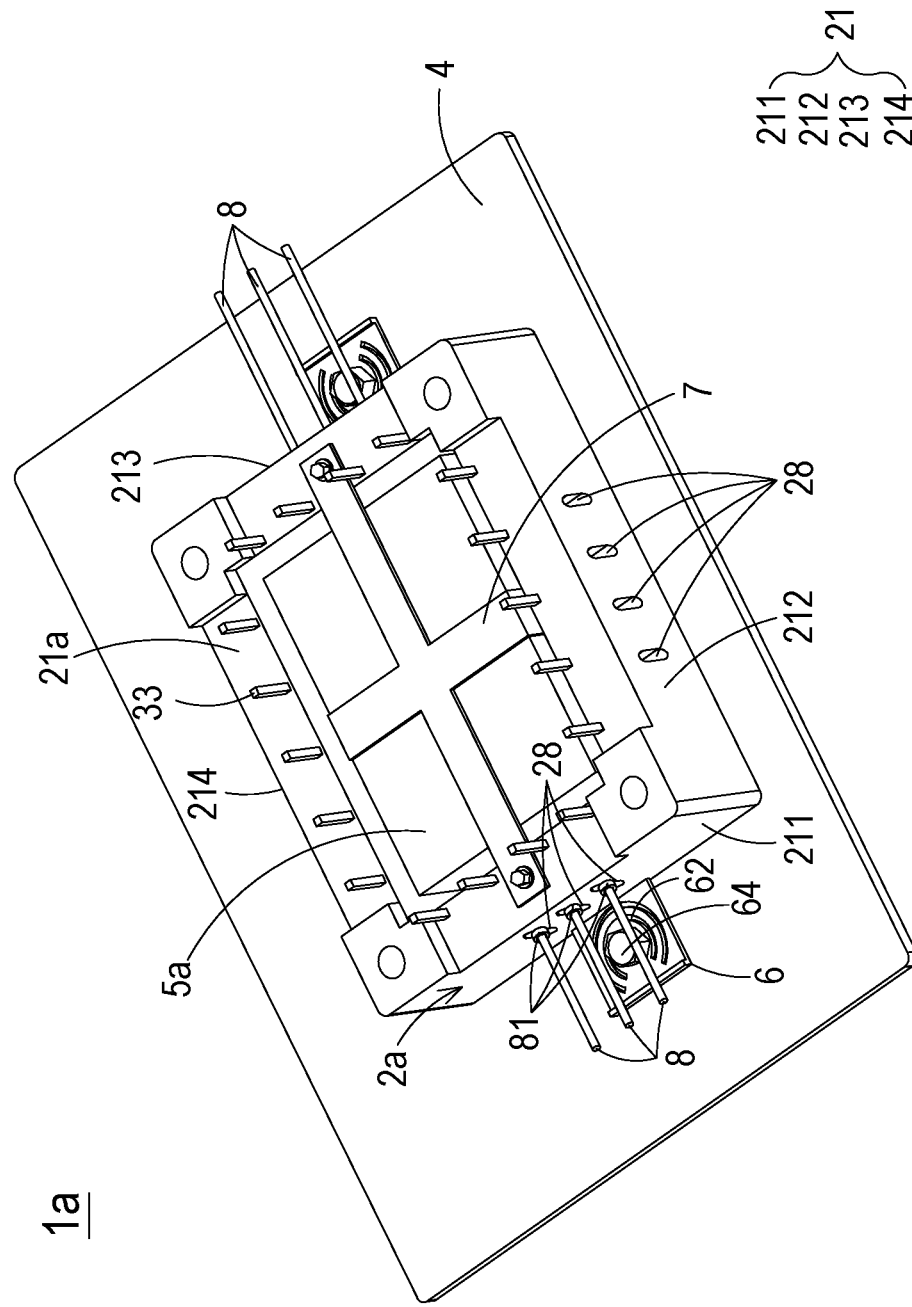
FIG. 2A is a schematic perspective view illustrating a package assembly according to a second embodiment of the present invention.
Figure 2B:
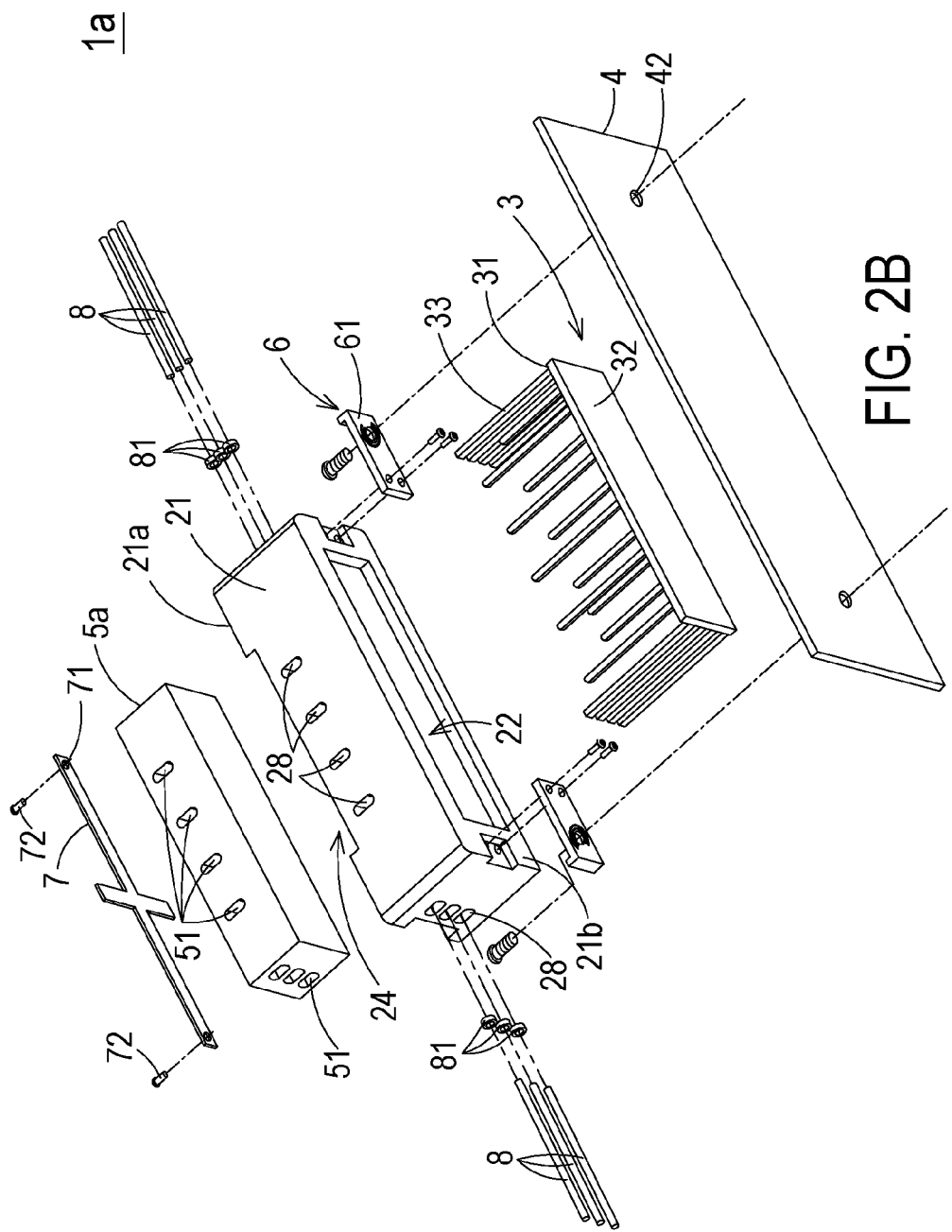
FIG. 2B is a schematic exploded view illustrating the package assembly of FIG. 2A.
Figure 2C:
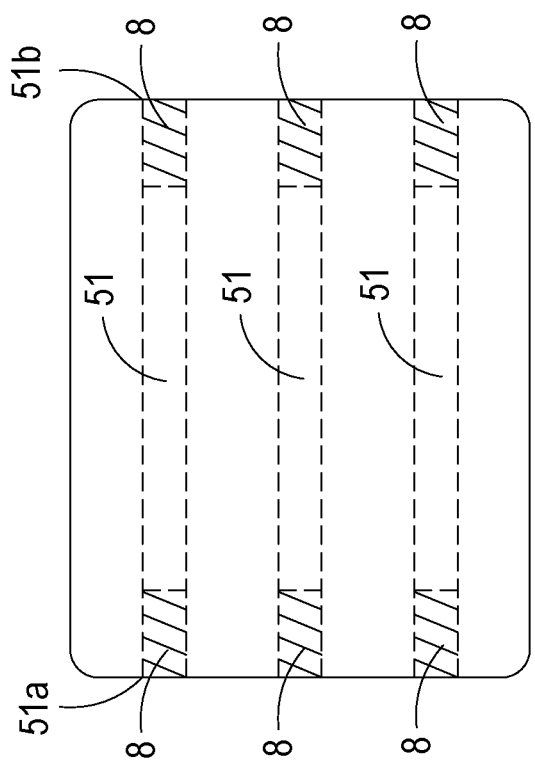
FIG. 2C schematically illustrates a second heat dissipating module of the package assembly of FIG. 2A.

Please refer to FIGS. 2A-2C. FIG. 2A is a schematic perspective view illustrating a package assembly according to a second embodiment of the present invention. FIG. 2B is a schematic exploded view illustrating the package assembly of FIG. 2A. FIG. 2C schematically illustrates a second heat dissipating module of the package assembly of FIG. 2A. Component parts and elements corresponding to those of the first embodiment are designated by identical numeral references, and detailed descriptions thereof are omitted. In comparison with the package assembly of the first embodiment, the package assembly 1a of this embodiment further comprises plural heat pipes 8, the frame plates of the housing frame 2a further comprises plural first slots 28, and the second heat dissipating module 5a further comprises plural channels 51. Each channel 51 comprises an inlet 51a and an outlet 51b. The plural first slots 28 run through two opposite frame plates of the housing frame 2a. In this embodiment, three first slots 28 run through the first frame plate 211, and three corresponding first slots 28 run through the third frame plate 213. It is noted that the number of the first slots 28 is not restricted. Moreover, the plural channels 51 are disposed within the second heat dissipating module 5a and run through two opposite sides of the second heat dissipating module 5a. The inlets 51a of the channels 51 are aligned with the corresponding first slots 28 of the first frame plate 211. The outlets 51b of the channels 51 are aligned with the corresponding first slots 28 of the third frame plate 213. An end of each heat pipe 8 is penetrated through the corresponding first slot 28 of the housing frame 2a and inserted into the corresponding channel 51 of the second heat dissipating module 5a. Moreover, the end of each heat pipe 8 is fixed in and connected to the corresponding channel 51 of the second heat dissipating module 5a. Each heat pipe 8 is used for transferring a cooling fluid. An example of the cooling fluid includes but is not limited to water. Under this circumstance, the second heat dissipating module 5a is an active heat dissipating module (e.g. a water-cooled heat sink) for dissipating away the heat of the power module 3.

For facilitating inserting the heat pipe 8 into the corresponding first slot 28, the diameter of the first slot 28 is slightly larger than the outer diameter of the heat pipe 8. In some embodiments, the first slots 28 are elongated slots. Moreover, the package assembly 1a further comprises plural positioning elements 81 corresponding to the plural heat pipes 8. Preferably but not exclusively, the positioning elements 81 are washers or nuts. The positioning element 81 is sheathed around the end of the corresponding heat pipe 8. After the corresponding heat pipe 8 is penetrated through the corresponding first slot 28 and connected with the corresponding channel 51 of the second heat dissipating module 5a, the positioning element 81 is locked into the corresponding first slot 28. Consequently, the positioning element 81 can assist in positioning the heat pipe 8. In some embodiments, the inlet 51a and the outlet 51b of the channel 51 have inner threads, and the end of the heat pipe 8 has outer threads corresponding to the inner threads. Due to the engagement between the inner threads and the outer threads, the heat pipe 8 can be securely connected with the corresponding channel 51.

Figure 3:
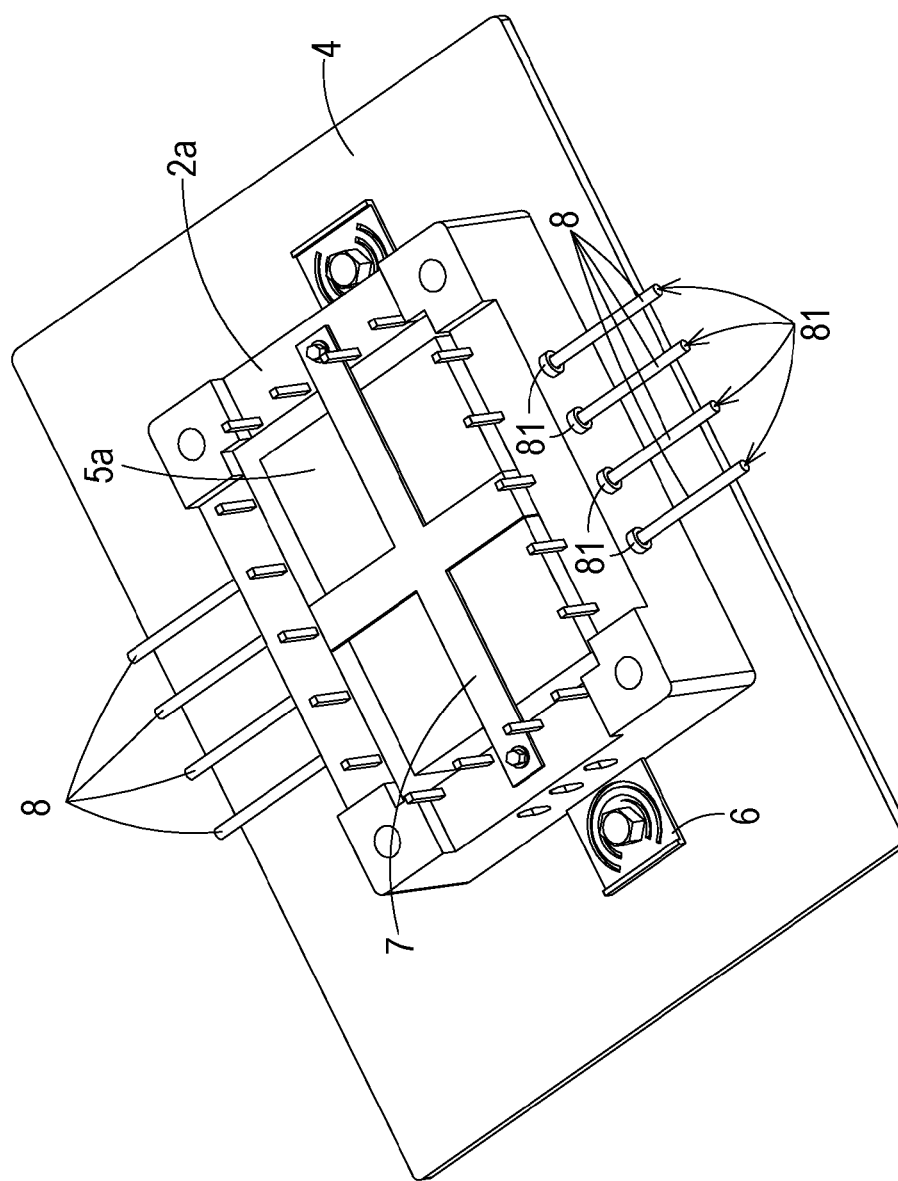
FIG. 3 is a schematic perspective view illustrating a variant example of the package assembly of FIG. 2A.

FIG. 3 is a schematic perspective view illustrating a variant example of the package assembly of FIG. 2A. In comparison with the package assembly of FIG. 2A, the numbers and arrangements of the plural heat pipes and the positioning elements of the package assembly 1b of this embodiment are distinguished. In this embodiment, four first slots 28 run through the second frame plate 212, and four corresponding first slots 28 run through the fourth frame plate 214. It is noted that the number of the first slots is not restricted. Moreover, the plural heat pipes 8 are positioned in the second frame plate 212 and the fourth frame plate 214.

The package assembly of the present invention can be applied to an electronic device. According to the layout of the electronic device, the plural heat pipes 8 are selectively positioned in the first frame plate 211 and the third frame plate 213 (see FIG. 2A) or positioned in the second frame plate 212 and the fourth frame plate 214 (see FIG. 3). That is, the number of the heat pipes 8 may be determined according to the required heat dissipating efficiency.

In the above embodiments as shown in FIGS. 2A and 3, the first heat dissipating module 4 is a cold plate. Moreover, the second heat dissipating module 5a is replaceable. Preferably, the second heat dissipating module 5a is selected from a general heat sink (e.g., a cold plate) or a water-cooled heat sink. Since the second heat dissipating module 5a is selectively a passive heat dissipating module or an active heat dissipating module according to the practical requirements, the utilization flexibility of the package assembly of the present invention is enhanced.

From the above descriptions, the present invention provides a package assembly for packaging a power module. A first heat dissipating module is attached on a second surface of the power module. A second heat dissipating module is disposed within a housing frame and attached on a first surface of the power module. Consequently, the heat of the power module can be dissipated away by a double side cooling mechanism. Consequently, the heat dissipating efficiency and the operation performance of the package assembly are enhanced, and the life span of the power module is extended. Moreover, since the package assembly is capable of actively dissipating the heat of the power module to the surroundings, the heat dissipating efficiency and the operation performance of the package assembly are further enhanced.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:
1. A package assembly, comprising:
a first heat dissipating module;
a housing frame fixed on the first heat dissipating module, and comprising a top part, a bottom part, plural frame plates and a hollow part, wherein the hollow part has a first open end and a second open end, wherein the first open end is located beside the bottom part, the second open end is located beside the top part, and the top part has at least one opening;
a power module disposed within the hollow part of the housing frame, and covering the first open end of the hollow part, wherein the power module comprises a first surface, a second surface and at least one pin, the first surface and the second surface are opposed to each other, the first surface has a periphery region and a middle region, the second surface of the power module is attached on the first heat dissipating module, and the at least one pin is disposed on the periphery region of the first surface of the power module, wherein the at least one pin is penetrated through the corresponding opening and partially exposed outside the top part of the housing frame; and
a second heat dissipating module disposed within the hollow part of the housing frame and attached on the middle region of the first surface of the power module, wherein the second heat dissipating module is a replaceable cold plate or a replaceable water-cooled heat sink.

2. The package assembly according to claim 1, wherein the top part of the housing frame further comprises an extension structure, wherein the at least one opening is formed in the extension structure and in communication with the hollow part.

3. The package assembly according to claim 1, wherein the first heat dissipating module is a cold plate.

4. The package assembly according to claim 1, wherein the housing frame further comprises:

two mounting brackets connected with the bottom part of the housing frame and located at two opposite sides of the bottom part of the housing frame, wherein each mounting bracket has a first mounting hole, and the first heat dissipating module has two second mounting holes corresponding to the first mounting holes; and
two fastening elements penetrated through the corresponding first mounting holes of the mounting brackets and tightened into the corresponding second mounting holes of the first heat dissipating module, so that the housing frame is fixed on the first heat dissipating module.

5. The package assembly according to claim 1, further comprising a fixing member, wherein the fixing member is fixed on the top part of the housing frame and contacted with the second heat dissipating module, so that the second heat dissipating module is fixed in the hollow part of the housing frame.

6. The package assembly according to claim 1, further comprising plural heat pipes, wherein plural first slots are formed in two opposite frame plates of the housing frame, and the second heat dissipating module further comprises plural channels corresponding to the plural first slots.

7. The package assembly according to claim 6, wherein an end of each heat pipe is penetrated through the corresponding first slot of the housing frame and partially inserted into the corresponding channel of the second heat dissipating module, so that the heat pipe is connected with the corresponding channel of the second heat dissipating module.

8. The package assembly according to claim 6, wherein a cooling fluid flows through the heat pipes.

* * * * *